(12) United States Patent
Yang

(10) Patent No.: US 6,858,913 B2
(45) Date of Patent: Feb. 22, 2005

(54) FUSE STRUCTURE WINDOW

(75) Inventor: Wu-Der Yang, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/426,216

(22) Filed: Apr. 30, 2003

(65) Prior Publication Data

US 2004/0012072 A1 Jan. 22, 2004

(30) Foreign Application Priority Data

Jul. 19, 2002 (TW) ........................................ 91116116 A

(51) Int. Cl.$^7$ .............................................. H01L 29/00
(52) U.S. Cl. ....................... 257/529; 257/208; 257/209; 257/530
(58) Field of Search ................................. 257/208, 209, 257/529, 530, 758, 759, 760, 324, 635; 438/132, 215, 281, 333, 467, 601, 131, 118, 622, 623, 591, 957

(56) References Cited

U.S. PATENT DOCUMENTS

| | | | | |
|---|---|---|---|---|
| 6,100,118 A | * | 8/2000 | Shih et al. | 438/132 |
| 6,121,073 A | * | 9/2000 | Huang et al. | 438/132 |
| 6,162,686 A | * | 12/2000 | Huang et al. | 438/281 |
| 6,288,436 B1 | * | 9/2001 | Narayan et al. | 257/529 |

* cited by examiner

*Primary Examiner*—Donghee Kang
*Assistant Examiner*—Quang Vu
(74) *Attorney, Agent, or Firm*—Ladas & Parry LLP

(57) ABSTRACT

The present invention provides a fuse structure. The fuse structure comprises a substrate, a plurality of conductive layers, a plurality of dielectric layers and a plurality of conductive plugs. The novel fuse structure includes a plurality of fuse units, and a new layout of the fuse units to increase the pitch between the fuse units, preventing the fuse structure from failing when misalignment of the laser beam and thermal scattering of the laser beam damage the second layer of the fuse structure in the laser blow process, thus increasing reliability and yield.

24 Claims, 7 Drawing Sheets

FUSE STRUCTURE WINDOW

BACKGROUND OF THE INVENTION

1. Field of the Invention

The present invention relates to a fuse structure and in particular a fuse structure that avoids damage from the laser blow process in its laser spot.

2. Description of the Related Art

Fuses are routinely used in the design of monolithic integrated circuits (IC), and particular in memory devices as elements for altering the configuration of the circuitry contained therein. As such, memories are commonly built with programmed capabilities wherein fuses are selectively "blown" by a laser beam.

It is well known that random access memories (RAM) are designed with redundancies which include spare columns, rows, or even fully functional arrays, such that when any element fails, the defective row, column and the like are replaced by a corresponding element. Disabling and enabling of spare elements are accomplished by fuses which are blown when required, preferably, by a laser beam.

Additionally, the technique of laser fuse deleting (trimming) has been widely used in both memory and logic IC fabrication industries, as an effective way to improve functional yields and to reduce development cycle time. Yet, fuse blow yield and fuse reliability are problematic in most conventional fuse designs.

FIG. 1 is a sectional view of a traditional fuse structure, FIG. 2 is a top view of a traditional fuse structure, and FIG. 1 shows a cross section C–C' of FIG. 2.

Referring to FIG. 1, symbol 100 shows a substrate having a laser spot 110. A metal layer M0 is formed on part of the substrate 100. A metal layer M1 is formed on part of the oxide layer, between the metal layer M0 and metal layer M1 having a oxide layer 120. A conductive plug 130 to penetrate the oxide layer 120 electrically connected the metal M0 layer and M1 layer. A laser spot 110 on part of the metal M1 layer and the top of a part of the oxide layer 120 forms a fuse window 140. The symbol 150 is a passivation layer.

FIG. 2 is a top view of FIG. 1, showing a plurality of fuse structures 210, 220, 230, 240 in fuse window 140. Each fuse structure comprises an M0 layer, conductive plug 130 and M1 layer. The solid line area shows the M1 layer, the dashed line area shows M0 layer, and each fuse structure comprises its own optimal laser spot 11. To give an example, a laser beam 290 blows the position 110 of the fuse structure 220. Because of misalignment of the laser beam 290 or thermal scattering of the laser beam 290, thermal shock from the laser blow process can damage the M0 layer. This can cause cracking, seriously affecting device reliability, and yield.

SUMMARY OF THE INVENTION

Accordingly, the invention provides a fuse structure comprising a substrate, a plurality of conductive layers, a dielectric layer, and a plurality of conductive plugs in a new arrangement, increasing the distance between different fuse units.

The invention also provides a fuse window having a plurality of fuse structures, each comprising a substrate, a plurality of conductive layers, a plurality of dielectric layers, and a plurality of conductive plugs. The fuse units are not electrically connected to each other.

A detailed description is given in the following embodiments with reference to the accompanying drawings.

The third object of the invention is to provide a processing method for the fuse structure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
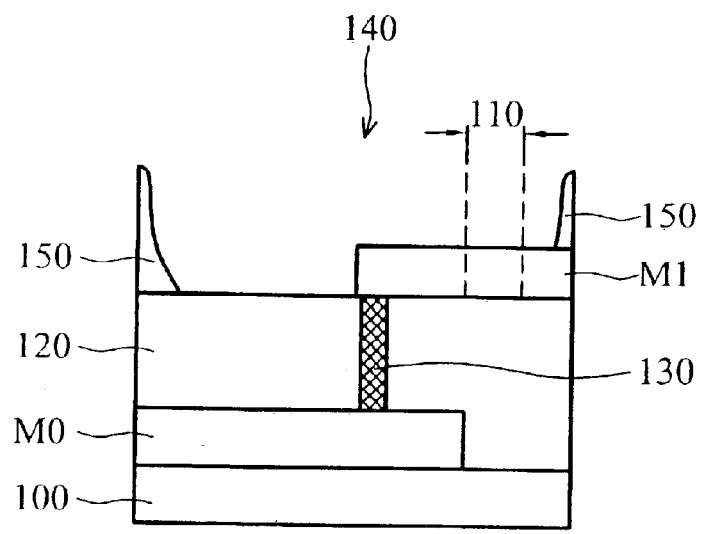
FIG. 1 is a sectional view of a traditional fuse structure.
Figure 2:
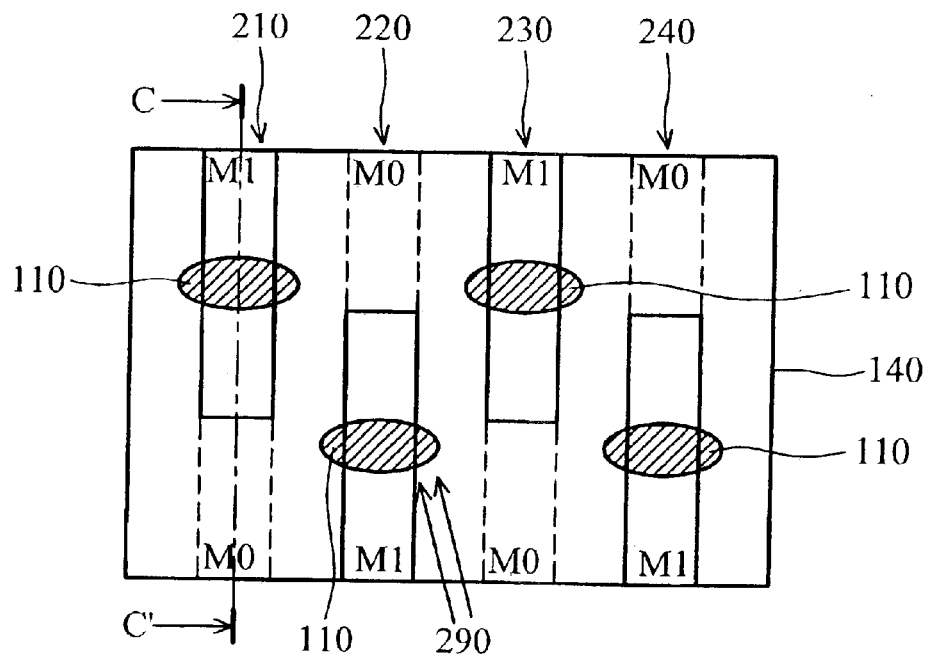
FIG. 2 is a sectional view of a traditional fuse structure, and shows a top view of FIG. 1.
Figure 3A:
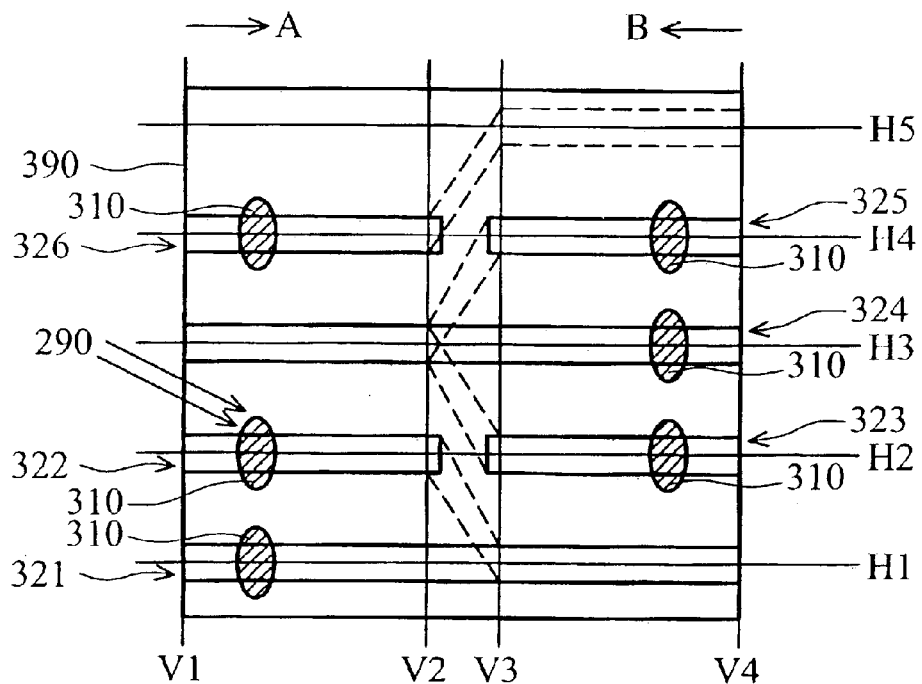
FIGS. 3A, 4A are top views of fuse structure of the present invention.
Figure 3B:
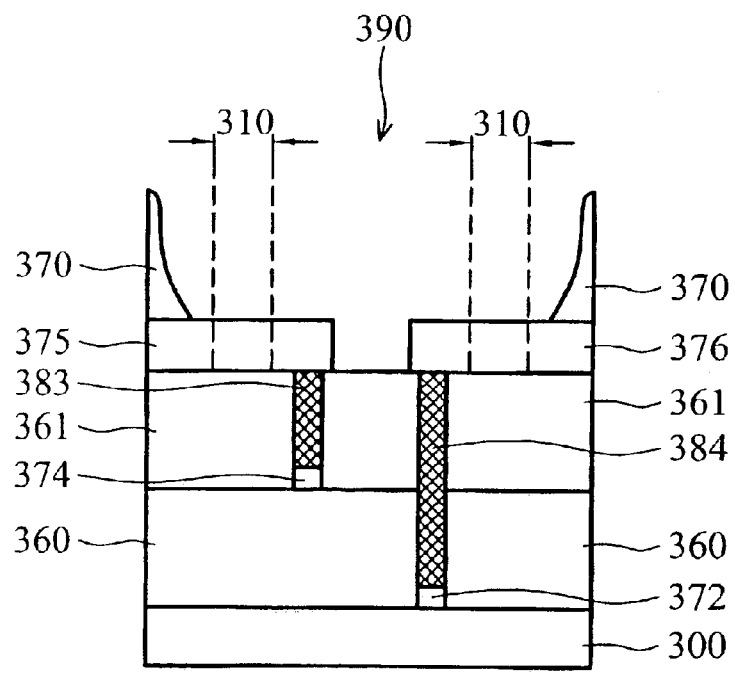
FIGS. 3B, 3C, and 3D are sectional views of FIG. 3A.
Figure 3C:
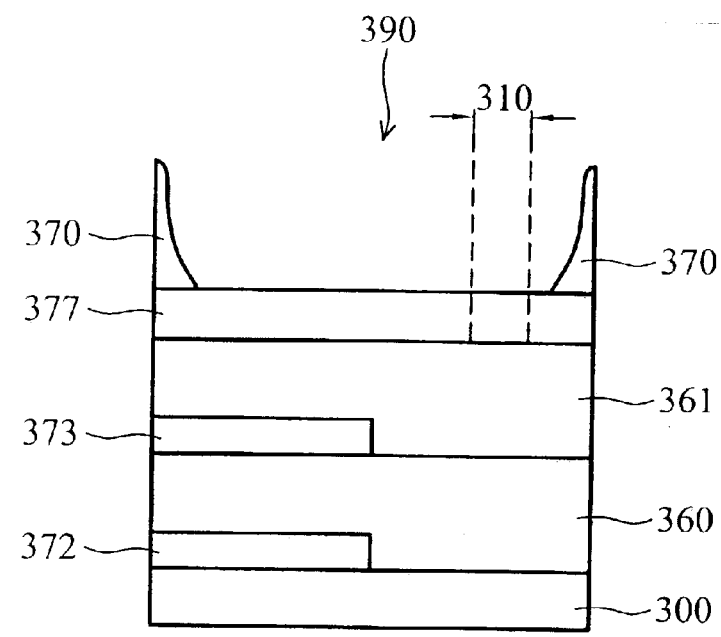
Figure 3D:
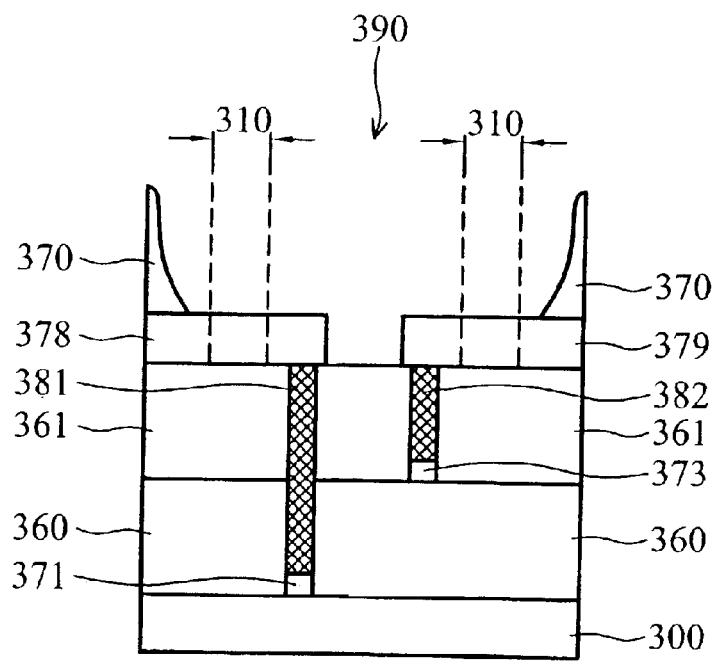

A fuse structure of the first embodiment is shown in FIG. 3A, FIG. 3B, FIG. 3C, and FIG. 3D. FIG. 3A is a top view of the fuse structure of the present invention. FIG. 3B, 3C, and 3D are sectional views of FIG. 3A. FIG. 3B is a cross section of the fourth horizontal line H4 of FIG. 3A. FIG. 3C is a cross section of the third horizontal line H3 of FIG. 3A. FIG. 3D is a cross section of the second horizontal line H2 of FIG. 3A.

In the first embodiment, the first horizontal line H1, the second horizontal line H2, the third horizontal line H3, the fourth horizontal line H4 and the fifth horizontal line H5 are arranged in order. The first vertical line V1, the second vertical line V2, the third vertical line V3, the fourth vertical line V4 are arranged in order. The second vertical line V2 is close to the third vertical line V3, to increase the distance between the first vertical line V1 and the second vertical line V2, and the distance between the third vertical line V3 and the fourth vertical line V4.

FIG. 3B shows a substrate 300. In FIG. 3A, a first conductive layer 371 (dotted line) is formed on part of the substrate 300. The first conductive layer 371 starts from a fourth vertical line V4 along a first horizontal line H1 in a second direction B, turning in an intersection of a second vertical line V2 and a second horizontal line H2. A second conductive layer 372 (dotted line) is formed on part of the substrate 300. The second conductive layer starts from a first vertical line V1 along a third horizontal line H3 in a first direction A, turning in an intersection of a third vertical line V3 and a fourth horizontal line H4. The first conductive layer 371 and the second conductive layer 372 are tungsten or polysilicon. In FIG. 3B, a dielectric layer 360 is formed on the first conductive layer 371, the second conductive layer 372, and the substrate 300. The first dielectric layer 360 is SiO$_2$. In FIG. 3D a plurality of openings are formed on the first dielectric layer 360 to expose the first conductive layer 371 and near a laser spot 310 side of the second conductive layer 372, to put into a first conductive plug 381 and a fourth conductive plug 384. The first conductive plug 381 and the fourth conductive plug 384 are tungsten or polysilicon.

FIG. 3A shows a third conductive layer 373. The third conductive layer 373 (dotted line) is formed on part of the first dielectric layer 360, wherein a layout of the third conductive layer 373 starts from the first vertical line V1 along the third horizontal line H3 in the first direction A, turning in an intersection of the third vertical line V3 and the second horizontal line H2. A fourth conductive layer 374 (dotted line) is formed on part of the dielectric layer 360. The fourth conductive layer 374 starts from the fourth vertical line V4 along a fifth horizontal line H5 in the second direction B, turning in an intersection of the second vertical line V2 and the fourth horizontal line H4. The third conductive layer 373 and the fourth conductive layer 374 are tungsten or polysilicon. FIG. 3B shows sectional views of FIG. 3A. The first dielectric layer 360, the third conductive layer 373 and the fourth conductive layer 374 are formed on a second dielectric layer 361. The second dielectric layer is $SiO_2$. In FIG. 3D a plurality of openings are formed on the second dielectric layer 361 to expose the first conductive plug 381, the fourth conductive plug 384, the third conductive layer 373 and near the laser spot 310 side of the fourth conductive layer 374, into the first conductive plug 381, the second conductive plug 382, the third conductive plug 383 and the fourth conductive plug 384. The first conductive plug 381, the second conductive plug 382, the third conductive plug 383, and the fourth conductive plug 384 are tungsten or polysilicon.

In FIG. 3A a fifth conductive layer 375, a sixth conductive layer 376, a seventh conductive layer 377, a eighth conductive layer 378, a ninth conductive layer 379 and a tenth conductive layer 380 are formed on part of the second dielectric layer 361. The fifth conductive layer 375 starts from the first vertical line V1 along the fourth horizontal line H4 in the first direction A, and extend to the second vertical line V2. The sixth conductive layer 376 starts from the fourth vertical line V4 along the fourth horizontal line H4 in the second direction B and extends to the third vertical line V3. The seventh conductive layer 377 starts from the first vertical line V1 along the third horizontal line H3 and extends to the fourth vertical line V4. The eight conductive layer 378 starts from the first vertical line V1 along the second horizontal line H2 in the first direction A and extends to the second vertical line V2. The ninth conductive layer 379 starts from the fourth vertical line V4 along the second horizontal line H2 in the second direction B and extends to the third vertical line V3. The tenth conductive layer 380 starts from the first vertical line V1 along the first horizontal line H1 and extends to the fourth vertical line V4. The fifth conductive layer 375, the sixth conductive layer 376, the seventh conductive layer 377, the eighth conductive layer 378, the ninth conductive layer 379, and the tenth conductive layer 380 are tungsten or polysilicon. The first conductive layer 371, which is electrically connected to the first conductive plug 381 and the eighth conductive layer 378, is a fuse unit. The third conductive layer 373, which is electrically connected to the second conductive plug 382 and the ninth conductive layer 379, is a fuse unit. The fourth conductive layer 374, which is electrically connected to the third conductive plug 383 and the fifth conductive layer 375, is a fuse unit. The second conductive layer 372, which is electrically connected to the fourth conductive plug 384 and the sixth conductive layer 376, is a fuse unit. The seventh conductive layer 377 is a fuse unit. The tenth conductive layer 380 is a fuse unit. The passivation layer is PE-TEOS SiO2 or Si3N4.

FIG. 3A shows a fuse window 390, with a plurality of fuse structures (FIG. 3A only shows one fuse structure). Each fuse structure comprises fuse unit 321, fuse unit 322, fuse unit 323, fuse unit 324, fuse unit 325 and fuse unit 326, each with its own laser spot 310. The fuse unit 321, 322, 323, 324, 325 and 326 are not electrically connected to each other. A first laser spot is formed on the fifth conductive layer 375 of the fourth horizontal line. A second laser spot is formed on the sixth conductive layer 376 of the fourth horizontal line. A third laser spot is formed on the seventh conductive layer 377. A fourth laser spot is formed on the eighth conductive layer 378 of the second horizontal line. The fifth laser spot is formed on the ninth conductive layer 379 of the second horizontal line. A sixth laser spot is formed on the tenth conductive layer 380.

Figure 3E:
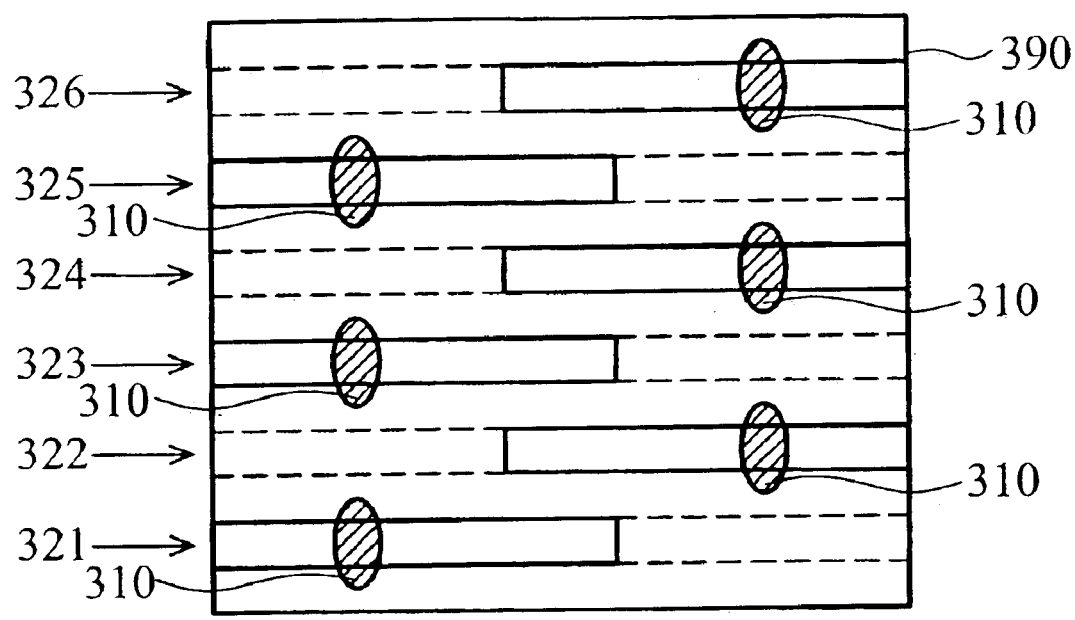
FIGS. 3E and 4E are top views of a traditional fuse structure.

In FIG. 3A, FIG. 3C and FIG. 3D, laser beam 290 blows the laser spot 310 in the eighth conductive layer 378 of the fuse unit 322. Misalignment of the laser beam 290 or thermal shock from the laser blow process can damage part of the third conductive layer 373 of fuse unit 323. FIG. 3E shows a traditional fuse structure in the same fuse area comprising six fuse units. The distance between fuse units of the first embodiment is more than in the prior art, thus receiving less damage from the laser blow process. In the first embodiment of the present invention the distance between the fourth laser spot 310 and adjacent to the fuse unit 322 of the third conductive layer 373 is 1.5 times that of the prior art.

Figure 4A:
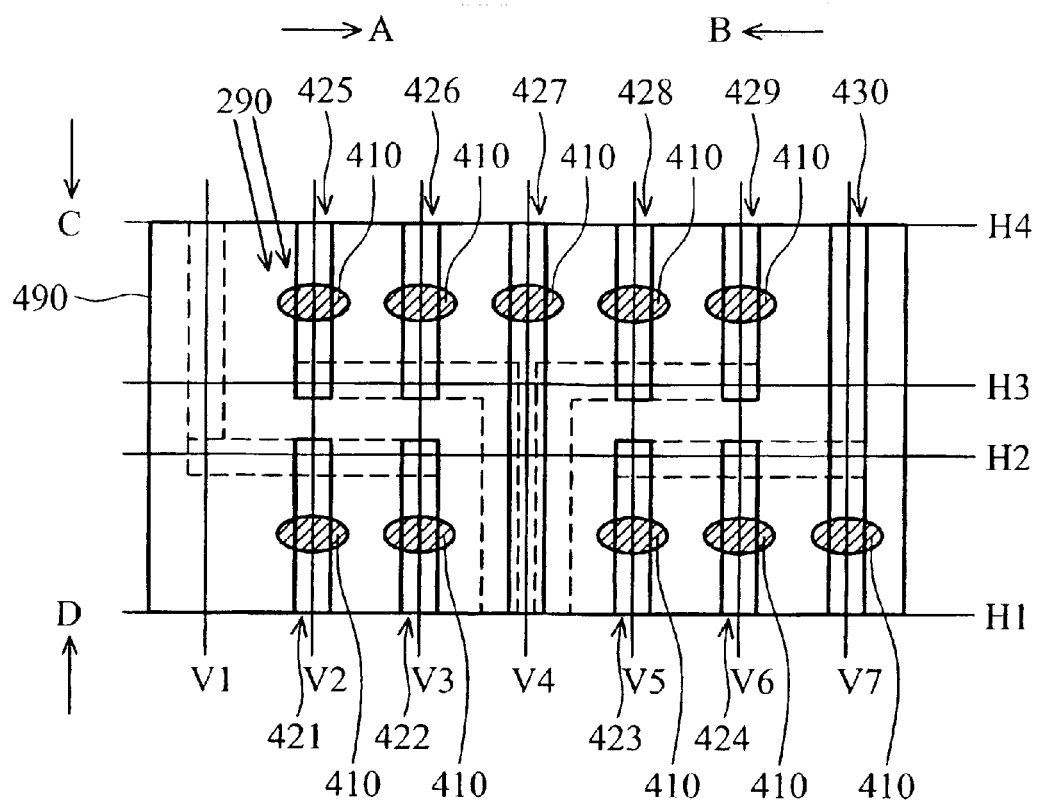
Figure 4B:
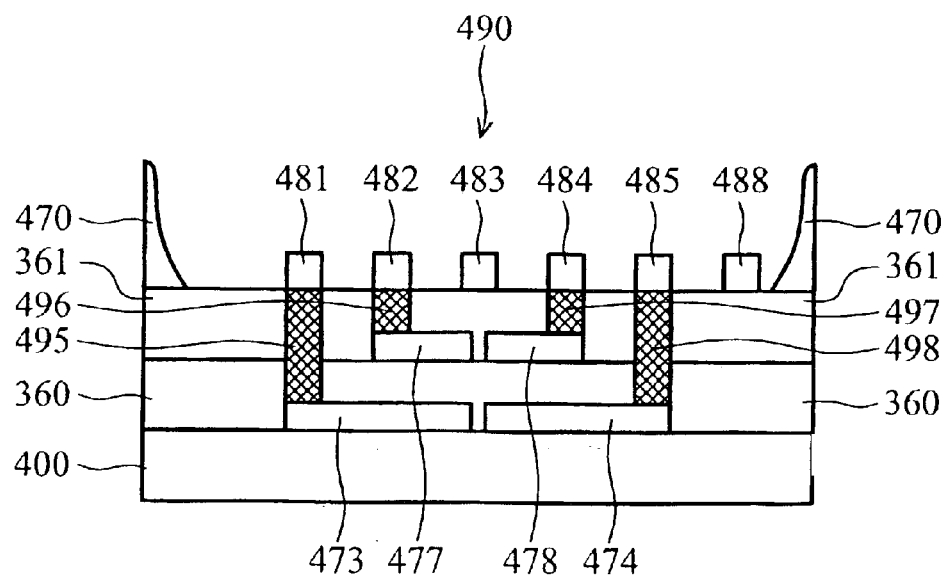
FIGS. 4B, 4C, and 4D are sectional views of FIG. 4A.
Figure 4C:
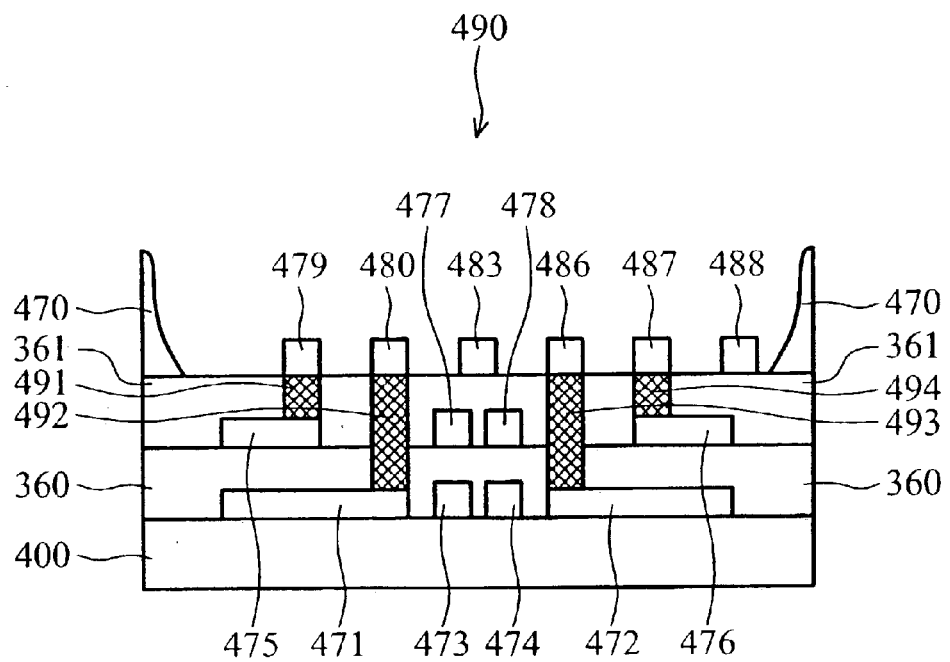
Figure 4D:
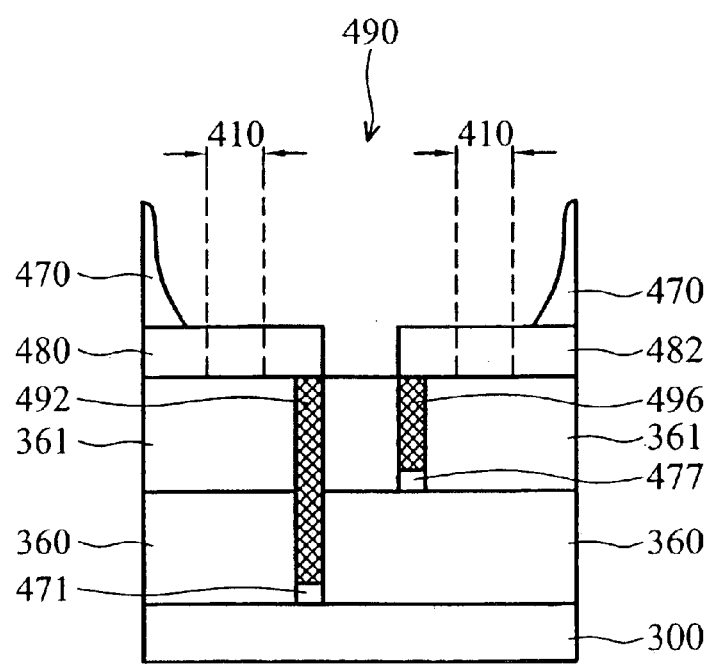

The second embodiment of the present invention is depicted in FIG. 4A, FIG. 4B, FIG. 4C and FIG. 4D. FIG. 4A is a top view of the fuse structure of the present invention. FIGS. 4B, 4C and 4D are sectional views of FIG. 4A. FIG. 4B shows a cross section of the third horizontal line H3 of FIG. 4A. FIG. 4C shows a cross section of the second horizontal line H2 of FIG. 4A. FIG. 4D shows a cross section of the third vertical line V3 of FIG. 4A.

In the second embodiment, the first horizontal line H1, the second horizontal line H2, the third horizontal line H3 and the fourth horizontal line H4 are arranged in order. The first vertical line V1, the second vertical line V2, the third vertical line V3, the fourth vertical line V4 the fifth vertical line V5, the sixth vertical line V6 and the seventh vertical line V7 are arranged in order.

In FIG. 4B shows a substrate 400. In FIG. 4A an eleventh conductive layer 471 (dotted line) is formed on part of the substrate 400, wherein a layout of the eleventh conductive layer 471 starts from a fourth horizontal line H4 along a first vertical line V1 and extends to a second horizontal line H2 along a second horizontal line H2, turning in a third vertical line V3. A twelfth conductive layer 472 (dotted line) is formed on part of the substrate 400. The twelfth conductive layer 472 starts from a fourth horizontal line H4 along a seventh vertical line V7 and extends to the second horizontal line H2 along the second horizontal line H2, turning in a fifth vertical line V5. A thirteenth conductive layer (dotted line) is formed on part of the substrate 400. The thirteenth conductive layer 473 starts from the second vertical line V2 along a third horizontal line H3 and extends near to a fourth vertical line V4 along the fourth vertical line V4, turning in a first horizontal line H1. A fourteenth conductive layer 474 (dotted line) is formed on part of the substrate 400. The fourteenth conductive layer 474 starts from a sixth vertical line V6 along the third horizontal line H3 and extends to the fourth vertical line V4 along the fourth vertical line V4, turning in the first horizontal line H1. The eleventh conductive layer 471, the twelfth conductive layer 472, the thirteenth conductive layer 473, the fourteenth conductive layer 474 are tungsten or polysilicon. The first dielectric layer 360 is formed on the substrate 400, the eleventh conductive layer 471, the twelfth conductive layer 472, the thirteenth conductive layer 473 and the fourteenth conductive layer 474. The first dielectric layer 360 is $SiO_2$.

In FIG. 4A a fifteenth conductive layer 475, a sixteenth conductive layer 476, a seventeenth conductive layer 477 and an eighteenth conductive layer 478 are formed on part of the dielectric layer 360. The fifteenth conductive layer 475 (dotted line) starts from the first vertical line V1 along the second horizontal line H2 and extends to the second vertical line V2. The sixteenth conductive layer 476 (dotted line) starts from the seventh vertical line V7 along the second horizontal line H2 and extends to the sixth vertical line V6. The seventeenth conductive layer 477 (dotted line) starts from the third vertical line V3 along the third horizontal line H3 and extends to near the fourth vertical line V4 along the fourth vertical line V4, turning in the first horizontal line H1. The eighteenth conductive layer 478 (dotted line) starts from the fifth vertical line V5 along the third horizontal line H3 and extends near to the fourth vertical line V4 along the fourth vertical line V4, turning in the first horizontal line H1. The fifteenth conductive layer 475, the sixteenth conductive layer 476, the seventeenth conductive layer 477 and the eighteenth conductive layer are tungsten or polysilicon. The first dielectric layer 360, the fifteenth conductive layer 475, the sixteenth conductive layer 476, the seventeenth conductive layer 477 and the eighteenth conductive layer are formed on a second dielectric layer 361. The second dielectric layer is $SiO_2$. FIG. 4B, FIG. 4C and FIG. 4D show a plurality of openings formed on the dielectric layer 361 to expose the eleventh conductive layer 371, the twelfth conductive layer 372, the thirteenth conductive layer 373, the fourteenth conductive layer 374, the fifteenth conductive layer 375, the sixteenth conductive layer 376, the seventeenth conductive layer 377 and the eighteenth conductive layer near the laser spot 410 into a eleventh conductive plug 491, a twelfth conductive plug 492, a thirteenth conductive plug 493, a fourteenth conductive plug 494, a fifteenth conductive plug 495, a sixteenth conductive plug 496, a seventeenth conductive plug 497 and an eighteenth conductive plug 498. The eleventh conductive plug 491, the twelfth conductive plug 492, the thirteenth conductive plug 493, the fourteenth conductive plug 494, the fifteenth conductive plug 495, the sixteenth conductive plug 496, the seventeenth conductive plug 497 and the eighteenth conductive plug 498 are tungsten or polysilicon.

In FIG. 4A a ninth conductive layer 479, a twentieth conductive layer 480, a twenty first conductive layer 481, a twenty second conductive layer 482, a twenty third conductive layer 483, a twenty fourth conductive layer 484, a twenty fifth conductive layer 485, a twenty sixth conductive layer 486, a twenty seventh conductive layer 487 and a twenty eighth conductive layer 488 are formed on part of the second dielectric layer 361. The nineteenth conductive layer 479 starts from the first horizontal line H1 along the second vertical line V2 in the fourth direction D and extends to the second horizontal line H2. The twentieth conductive layer 480 starts from the first horizontal line H1 along the third vertical line V3 and extends to the second horizontal line H2. The twenty first conductive layer 481 starts from the fourth horizontal line H4 along the second vertical line V2 and extends to the third horizontal line H3. The twenty second conductive layer 482 starts from the fourth horizontal line H4 along the third vertical line V3 and extends to the third horizontal line H3. The twenty third conductive layer 483 starts from the first horizontal line H1 along the fourth vertical line V4 and extends to the fourth horizontal line H4. The twenty fourth conductive layer 484 starts from the fourth horizontal line H4 along the fifth vertical line V5 and extends to the third horizontal line H3. The twenty fifth conductive layer 485 starts from the fourth horizontal line H4 along the sixth vertical line V6 and extends to the third horizontal line H3. The twenty sixth conductive layer 486 starts from the first horizontal line H1 along the fifth vertical line V5 and extends to the second horizontal line H2. The twenty seventh conductive layer 487 starts from the first horizontal line H1 along the sixth vertical line V6 and extends to the second horizontal line H2. The twenty eighth conductive layer 488 starts from the first horizontal line H1 along the seventh vertical line V7 and extends to the fourth horizontal line H4. The eleventh conductive plug 491, which is electrically connected to the fifteenth conductive layer 475 and the nineteenth conductive layer 479, is a fuse unit. The twelfth conductive plug 492, which is electrically connected to the eleventh conductive layer 471 and twentieth conductive layer 480, is a fuse unit. The thirteenth conductive plug 493, which is electrically connected to the twelfth conductive layer 472 and the twenty sixth conductive layer 486, is a fuse unit. The fourteenth conductive plug 494, which is electrically connected to the sixteenth conductive layer 476 and twenty seventh conductive layer 487, is a fuse unit. The fifteenth conductive plug 495, which is electrically connected to the thirteenth conductive layer 473 and the twenty first conductive layer 481, is a fuse unit. The sixteenth conductive plug 496, which is electrically connected to the seventeenth conductive layer 477 and twenty second conductive layer 482, is a fuse unit. The seventeenth conductive plug 497, which is electrically connected to the eighteenth conductive layer 478 and twenty fourth conductive layer 484, is a fuse unit. The eighteenth conductive plug 498, which is electrically connected to the fourteenth conductive layer 474 and the twenty fifth conductive layer 485, is a fuse unit. The twenty third conductive layer 483 is a fuse unit. The twenty eight conductive layer 488 is a fuse unit. The passivation layer is PE-TEOS SiO2 or Si3N4.

FIG. 4A shows a fuse window 490 with a plurality of fuse structures (FIG. 4A only shows one fuse structure). Each fuse structure comprises ten fuse units, fuse unit 421, fuse unit, 422, fuse unit 423, fuse unit 424, fuse unit 425, fuse unit 426, fuse unit 427, fuse unit 428, fuse unit 429 and fuse unit 430. Each fuse unit has its own laser spot 410. Fuse units 421, 422, 423, 424, 425, 426, 427, 428, 429 and 430 are not electrically connected to each other. An eleventh laser spot is formed on the nineteenth conductive layer 479. A twelfth laser spot is formed on the twentieth conductive layer 480. A thirteenth laser spot is formed on the twenty first conductive layer 481. A fourteenth laser spot is formed on the twentieth second conductive layer 482. A fifteenth laser spot is formed on the twenty third conductive layer 483. A sixteenth laser spot is formed on the twenty fourth conductive layer 484. The seventeenth laser spot is formed on the twenty fifth conductive layer 485. The eighteenth laser spot is formed on the twenty sixth conductive layer 486. The nineteenth laser spot is formed on twenty seventh conductive layer 487. The twentieth laser spot is formed on twenty eighth conductive layer 488.

Figure 4E:
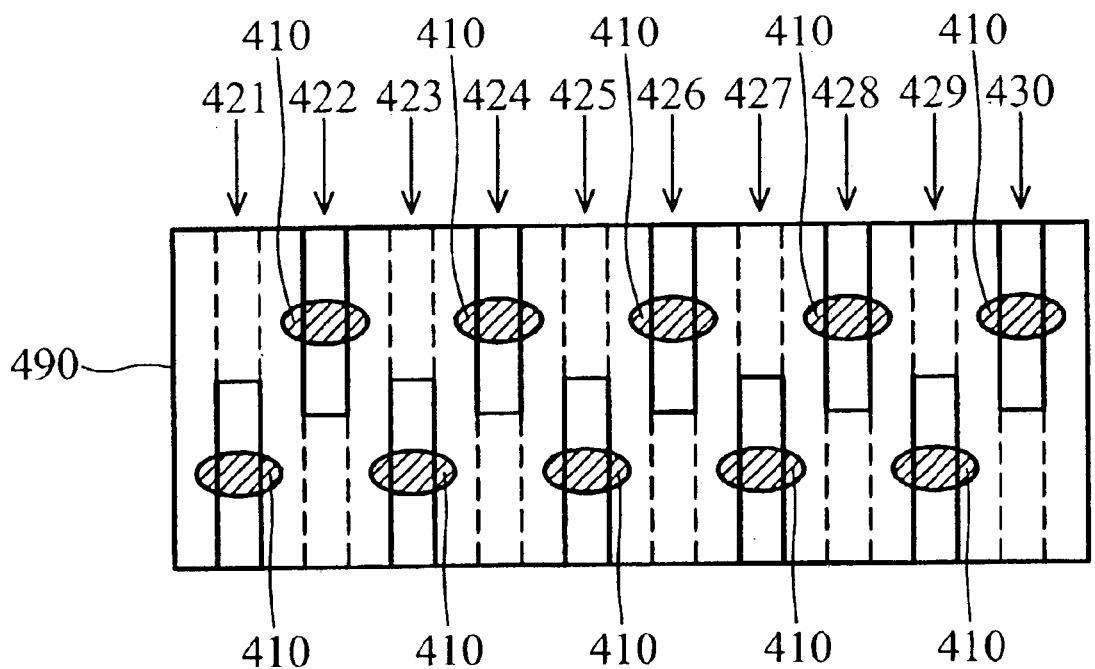

In FIG. 4A, FIG. 4B and FIG. 4D, laser beam 290 blows the laser spot 410 (the thirteenth laser spot) in the fuse unit 425 of the twenty first conductive layer 481. Misalignment of the laser beam 290 or thermal shock from the laser blow process can damage part of the eleventh conductive layer 471 adjacent to the fuse unit 422. FIG. 4E shows a traditional fuse structure in the same fuse area comprising ten fuse units. The distance between fuse units of the second embodiment is more than the prior art, thus receiving less damage from the laser blow process. In the second embodiment of the present invention the distance between the thirteenth laser spot 410 and adjacent to the eleventh conductive layer 471 is 1.66 times that in the prior art.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fuse structure, comprising:

a substrate;

a first conductive layer formed on part of the substrate, wherein a layout of the first conductive layer starts from a fourth vertical line along a first horizontal line in a second direction, turning in an intersection of a second vertical line and a second horizontal line;

a second conductive layer formed on part of the substrate, wherein a layout of the second conductive layer starts from a first vertical line along a third horizontal line in a first direction, turning in an intersection of a third vertical line and a fourth horizontal line;

a first dielectric layer formed on the first conductive layer, the second conductive layer and the substrate;

a third conductive layer formed on the part of the first dielectric layer, wherein a layout of the third conductive layer starts from the first vertical line along the third horizontal line in the first direction, turning in an intersection of the third vertical line and the second horizontal line;

a fourth conductive layer formed on the part of the first dielectric layer, wherein a layout of the fourth conductive layer starts from the fourth vertical line along a fifth horizontal line in the second direction, turning in an intersection of the second vertical line and the fourth horizontal line;

a second dielectric layer formed on the third conductive layer, the fourth conductive layer and the first dielectric layer;

a fifth conductive layer formed on part of the second dielectric layer, wherein a layout of the fifth conductive layer starts from the first vertical line along the fourth horizontal line in the first direction and extends to the second vertical line;

a sixth conductive layer formed on part of the second dielectric layer, wherein a layout of the sixth conductive layer starts from the fourth vertical line along the fourth horizontal line in the second direction and extends to the third vertical line;

a seventh conductive layer formed on part of the second dielectric layer, wherein a layout of the seventh conductive layer starts from the first vertical line along the third horizontal line and extends to the fourth vertical line;

a eighth conductive layer formed on part of the dielectric layer, wherein a layout of the eight conductive layer starts from the first vertical line along the second horizontal line in the first direction and extends to the second vertical line;

a ninth conductive layer formed on part of the second dielectric layer, a layout of the ninth conductive layer starts from the fourth vertical line along the second horizontal line in the second direction and extends to the third vertical line;

a tenth conductive layer formed on part of the second dielectric layer, a layout of the tenth conductive layer starts from the first vertical line along the first horizontal line and extends to the fourth vertical line; a first conductive plug formed on an intersection of the second vertical line and the second horizontal line to penetrate the first dielectric layer and the second dielectric layer to electrically connected to the first conductive layer and the eighth conductive layer;

a second conductive plug formed on an intersection of the third vertical line and the second horizontal line to penetrate the second dielectric layer to electrically connected to the third conductive layer and the ninth conductive layer;

a third conductive plug formed on an intersection of the second vertical line and the fourth horizontal line to penetrate the second dielectric layer to electrically connected to the fourth conductive layer and the fifth conductive layer; and a fourth conductive plug formed on an intersection of the third vertical line and the fourth horizontal line to penetrate the first dielectric layer and the second dielectric layer to electrically connected to the second conductive layer and the sixth conductive layer;

wherein the electrically connected first conductive layer, first conductive plug, and eighth conductive layer constitute a first fuse unit;

the electrically connected third conductive layer, second conductive plug, and ninth conductive layer constitute a second fuse unit;

the electrically connected fourth conductive layer, third conductive plug, and fifth conductive layer constitute a third fuse unit;

the electrically connected second conductive layer, fourth conductive plug, and sixth conductive layer constitute a fourth fuse unit;

the seventh conductive layer constitutes a fifth fuse unit; and the tenth conductive layer constitutes a sixth fuse unit.

2. The fuse structure as claimed in claim 1, wherein the first horizontal line, the second horizontal line, the third horizontal line, the fourth horizontal line and the fifth horizontal line are arranged in order, the first vertical line, the second vertical line, the third vertical line and the fourth vertical line are arranged in order, the distance between the first vertical line and the vertical line longer than the distance between the second vertical line and the third vertical line, and the distance between the third vertical line and the fourth vertical line is longer than the distance between the second vertical line and the third vertical line.

3. The fuse structure as claimed in claim 1, wherein the first conductive layer, the second conductive layer, the third conductive layer and the fourth conductive layer are tungsten or polysilicon.

4. The fuse structure as claimed in claim 1, wherein the fifth conductive layer, the sixth conductive layer, the seventh conductive layer, the eighth conductive layer, the ninth conductive layer and tenth conductive layer are aluminum, copper-aluminum alloy or polysilicon.

5. The fuse structure as claimed in claim 1, wherein the first conductive plug, the second conductive plug, the third conductive plug and the fourth conductive plug are tungsten or polysilicon.

6. The fuse structure as claimed in claim 1, wherein the first dielectric layer and the second dielectric layer are SiO2.

7. A fuse window having a plurality of fuse structures, each comprising:

a substrate;

a first conductive layer formed on part of the substrate, wherein a layout of the first conductive layer starts from a fourth vertical line along a first horizontal line in a second direction, turning in an intersection of a second vertical line and a second horizontal line;

a second conductive layer formed on part of the substrate, wherein a layout of the second conductive layer starts from a first vertical line along a third horizontal line in a first direction, turning in an intersection of a third vertical line and a fourth horizontal line;

a first dielectric layer formed on the first conductive layer, the second conductive layer and the substrate;

a third conductive layer formed on the part of the first dielectric layer, wherein a layout of the third conductive layer starts from the first vertical line along the third horizontal line in the first direction, turning in an intersection of the third vertical line and the second horizontal line;

a fourth conductive layer formed on the part of the first dielectric layer, wherein a layout of the fourth conductive layer starts from the fourth vertical line along a fifth horizontal line in the second direction, turning in an intersection of the second vertical line and the fourth horizontal line;

a second dielectric layer formed on the third conductive layer, the fourth conductive layer and the first dielectric layer;

a fifth conductive layer formed on part of the second dielectric layer, wherein a layout of the fifth conductive layer starts from the first vertical line along the fourth horizontal in the first direction and extends to the second vertical line;

a sixth conductive layer formed on part of the second dielectric layer, wherein a layout of the sixth conductive layer starts from the fourth vertical line along the fourth horizontal line in the second direction and extends the third vertical line;

a seventh conductive layer formed on part of the second dielectric layer, wherein a layout of the seventh conductive layer starts from the first vertical line along the third horizontal line and extends to the fourth vertical line;

a eighth conductive layer formed on part of the dielectric layer, wherein a layout of the eight conductive layer starts from the first vertical line along the second horizontal line in the first direction and extends to the second vertical line;

a ninth conductive layer formed on part of the second dielectric layer, and a layout of the ninth conductive layer starts from the fourth vertical line along the second horizontal line in the second direction and extends the third vertical line;

a tenth conductive layer formed on part of the second dielectric layer, and a layout of the tenth conductive layer starts from the first vertical line along the first horizontal line and extends to the fourth vertical line;

a first conductive plug formed on an intersection of the second vertical line and the second horizontal line to penetrate the first dielectric layer and the second dielectric layer to electrically connected to the first conductive layer and the eighth conductive layer;

a second conductive plug formed on an intersection of the third vertical line and the second horizontal line to penetrate the second dielectric layer to electrically connected to the third conductive layer and the ninth conductive layer;

a third conductive plug formed on an intersection of the second vertical line and the fourth horizontal line to penetrate the second dielectric layer to electrically connected to the fourth conductive layer and the fifth conductive layer;

a fourth conductive plug formed on an intersection of the third vertical line and the fourth horizontal line to penetrate the first dielectric layer and the second dielectric layer to electrically connected to the second conductive layer and the sixth conductive layer;

a first laser spot formed on the fifth conductive layer;

a second laser spot formed on the sixth conductive layer;

a third laser spot formed on the second laser spot of the seventh conductive layer;

a fourth laser spot formed on the eighth conductive layer;

a fifth laser spot formed on the ninth conductive layer; and a sixth laser spot formed on the fourth laser spot of the tenth conductive layer; wherein the electrically connected first conductive layer and eighth conductive layer constitute a first fuse unit;

the electrically connected third conductive layer and ninth conductive layer constitute a second fuse unit;

the electrically connected fourth conductive layer and fifth conductive layer constitute a third fuse unit;

the electrically connected second conductive and sixth conductive layer constitute a fourth fuse unit;

the seventh conductive layer constitutes a fifth fuse unit; and the tenth conductive layer constitutes a sixth fuse unit;

wherein the first through sixth fuse units are not electrically connected to each other.

8. The fuse window according to claim 7, wherein the first horizontal line, the second horizontal line, the third horizontal line, the fourth horizontal line and the fifth horizontal line are arranged in order, the first vertical line, the second vertical line, the third vertical line and the fourth vertical line are arranged in order, the distance between the first vertical line and the second vertical line longer than the distance between the second vertical line and the third vertical line, and the distance between the third vertical line and the fourth vertical line is longer than the distance between the second vertical line and the third vertical line.

9. The fuse window as claimed in claim 7, wherein the first conductive layer, the second conductive layer, the third conductive layer and the fourth conductive layer are tungsten or polysilicon.

10. The fuse window as claimed in claim 7, wherein the fifth conductive layer, the sixth conductive layer, the seventh conductive layer, the eighth conductive layer, the ninth conductive layer and tenth conductive layer are aluminum, copper-aluminum alloy or polysilicon.

11. The fuse window as claimed in claim 7, wherein the first conductive plug, the second conductive plug, the third conductive plug and the fourth conductive plug are tungsten or polysilicon.

12. The fuse window as claimed in claim 7, wherein the first dielectric layer and the second dielectric layer are SiO2.

13. A fuse structure comprising:

a substrate;

an eleventh conductive layer formed on part of the substrate, wherein a layout of the eleventh conductive layer starts from a fourth horizontal line along a first vertical line and extends to a second horizontal line along a second horizontal line, turning in a third vertical line;

a twelfth conductive layer formed on part of the substructure, wherein a layout of the twelfth conductive layer starts from a fourth horizontal line along a seventh vertical line and extends to the second horizontal line along the second horizontal line, turning in a fifth vertical line;

a thirteenth conductive layer formed on part of the substrate, wherein a layout of the thirteenth conductive layer starts from a second vertical line along a third horizontal line and extends near to a fourth vertical line along the fourth vertical line, turning in a first horizontal line;

a fourteenth conductive layer formed on part of the substrate, wherein a layout of the fourteenth conductive layer starts from a sixth vertical line along the third horizontal line and extends to the fourth vertical line along the fourth vertical line, turning in the first horizontal line;

a first dielectric layer formed on the eleventh conductive layer, the twelfth conductive layer, the thirteenth conductive layer, the fourteenth conductive layer and part of the substrate;

a fifteenth conductive layer formed on part of the first dielectric, wherein a layout of the fifteenth conductive layer starts from the first vertical line along the second horizontal line and extends near to a second vertical line;

a sixteenth conductive layer formed on part of the first dielectric layer, wherein a layout of the sixteenth conductive layer starts from a seventh vertical line along the second horizontal line and extends near to a sixth vertical line;

a seventeenth conductive layer formed on part of the first dielectric layer, wherein a layout of the seventeenth conductive layer starts from a third vertical line along the third horizontal line and extends near to the fourth vertical line along the fourth vertical line, turning in the first horizontal line;

an eighteenth conductive layer formed on part of the first dielectric layer, wherein a layout of the eighteenth conductive layer starts from a fifth vertical line along the third horizontal line and extends near to the fourth vertical line along the fourth vertical line, turning in the first horizontal line;

a second dielectric layer formed on the fifteenth conductive layer, the sixteenth conductive layer, the seventeenth conductive layer, the eighteenth conductive layer and part of the first dielectric layer;

a nineteenth conductive layer formed on part of the second dielectric layer, wherein a layout of the ninth conductive starts from the first horizontal line along the second vertical line and extends to the second horizontal line;

a twentieth conductive layer formed on part of the dielectric layer, wherein a layout of the twentieth conductive layer starts from the first horizontal line along the third vertical line and extends to the second horizontal line;

a twenty first conductive layer formed on part of the second dielectric layer, wherein a layout of the twenty first conductive layer starts from the fourth horizontal line along the second vertical line and extends to the third horizontal line;

a twenty second conductive layer formed on part of the second dielectric layer, wherein a layout of the twenty second conductive layer starts from the fourth horizontal line along the third vertical line and extends to the third horizontal line;

a twenty third conductive layer formed on part of the second dielectric layer, wherein a layout of the twenty third conductive layer starts from the first horizontal line along the fourth vertical line and extends to the fourth horizontal line;

a twenty fourth conductive layer formed on part of the dielectric layer, wherein a layout of the twenty fourth conductive layer starts from the fourth horizontal line along the fifth vertical line and extends to the third horizontal line;

a twenty fifth conductive layer formed on part of the second dielectric layer, wherein a layout of the twenty fifth conductive layer starts from the fourth horizontal line along the sixth vertical line and extends to the third horizontal line;

a twenty sixth conductive layer formed on part of second the dielectric layer, wherein a layout of the twenty sixth conductive starts from the first horizontal line along the fifth vertical line and extends to the second horizontal line;

a twenty seventh conductive layer formed on part of the second dielectric layer, wherein a layout of the twenty seventh conductive layer starts from the first horizontal line along the sixth vertical line and extends to the second horizontal line;

a twenty eighth conductive layer formed on part of the second dielectric layer, wherein a layout of the twenty eighth conductive layer starts from the first horizontal line along the seventh vertical line and extends to the fourth horizontal line;

a eleventh conductive plug formed on an intersection of the second vertical line and the second horizontal line to penetrate the second dielectric layer to electrically connected to the fifteenth conductive layer and the nineteenth conductive layer;

a twelfth conductive plug formed on an intersection of the third vertical line and the second horizontal line to penetrate the first dielectric layer and the second dielectric layer to electrically connected to the eleventh conductive layer and twentieth conductive layer;

a thirteenth conductive plug formed on an intersection of the fifth vertical line and the second horizontal line to penetrate the first dielectric layer and the second dielectric layer to electrically connected to the twelfth conductive layer and the twenty sixth conductive layer;

a fourteenth conductive plug formed on an intersection of the sixth vertical line and the second horizontal line to penetrate the second dielectric layer to electrically connected to the sixteenth conductive layer and twenty seventh conductive layer;

a fifteenth conductive plug formed on an intersection of the second vertical line and the third horizontal line to penetrate the first dielectric layer and the second dielectric layer to electrically connected to the thirteenth conductive layer and the twenty first conductive layer;

a sixteenth conductive plug formed on an intersection of the third vertical line and the third horizontal line to penetrate the second dielectric layer to electrically connected to the seventeenth conductive layer and twenty second conductive layer;

a seventeenth conductive plug formed on an intersection of the fifth vertical line and the third horizontal line to penetrate the second dielectric layer to electrically connected to the eighteenth conductive layer and twenty fourth conductive layer; and an eighteenth conductive plug formed on an intersection of the sixth vertical line and the third horizontal line to penetrate the first dielectric layer and the second dielectric layer to electrically connected to the fourteenth conductive layer and the twenty fifth conductive layer;

wherein the electrically connected eleventh conductive plug, fifteenth conductive layer, and nineteenth conductive layer constitute a first fuse unit;

the electrically connected twelfth conductive plug eleventh conductive layer, and twentieth conductive layer constitute a second fuse unit;

the electrically connected thirteenth conductive plug, twelfth conductive layer, and twenty sixth conductive layer constitute a third fuse unit;

the electrically connected fourteenth conductive plug, sixteenth conductive layer, and twenty seventh conductive layer constitute a fourth fuse unit;

the electrically connected fifteenth conductive plug, thirteenth conductive layer, and twenty first conductive layer constitute a fifth fuse unit;

the electrically connected sixteenth conductive plug, seventeenth conductive layer, and twenty second conductive layer constitute a sixth fuse unit;

the electrically connected seventeenth conductive plug, eighteenth conductive layer, and twenty fourth conductive layer constitute a seventh fuse unit;

the electrically connected eighteenth conductive plug, fourteenth conductive layer, and twenty fifth conductive layer constitute an eighth fuse unit;

the twenty third conductive layer constitutes a ninth fuse unit; and the twenty eight conductive layer constitutes a tenth fuse unit.

14. The fuse structure according to claim 13, wherein the fifteenth conductive layer, the sixteenth conductive layer, the seventeenth conductive layer, and the eighteenth conductive layer are tungsten or polysilicon.

15. The fuse structure according to claim 13, wherein the fifteenth conductive layer, the sixteenth conductive layer, the seventeenth conductive layer, and the eighteenth conductive layer are tungsten or polysilicon.

16. The fuse structure according to claim 13, wherein the nineteenth conductive layer, the twentieth conductive layer the twenty first conductive layer, the twenty second conductive layer, the twenty third conductive layer, the twenty fourth conductive layer, the twenty fifth conductive layer, the twenty sixth conductive layer, the twenty seventh conductive layer and the twenty eighth conductive layer are aluminum, copper-aluminum alloy or polysilicon.

17. The fuse structure according to claim 13, wherein the seventh conductive plug, the twelfth conductive plug, the thirteenth conductive plug, the fourteenth conductive plug, the fifteenth conductive plug, the sixteenth conductive plug, the seventeenth conductive plug and the eighteenth conductive plug are tungsten or polysilicon.

18. The fuse structure according to claim 13, wherein the first dielectric layer and the second dielectric layer are SiO2.

19. A fuse window comprising
a substrate;
an eleventh conductive layer formed on part of the substrate, wherein a layout of the eleventh conductive layer starts from a fourth horizontal line along a first vertical line and extends to a second horizontal line along a second horizontal line, turning in a third vertical line;

a twelfth conductive layer formed on part of the substructure, wherein a layout of the twelfth conductive layer starts from a fourth horizontal line along a seventh vertical line and extends to the second horizontal line along the second horizontal line, turning in a fifth vertical line;

a thirteenth conductive layer formed on part of the substrate, wherein a layout of the thirteenth conductive layer starts from a vertical line along a third horizontal line and extends near to a fourth vertical line along a fourth vertical line, turning in a first horizontal line;

a fourteenth conductive layer formed on part of the substrate, wherein a layout of the fourteenth conductive layer starts from a sixth vertical line along the third horizontal line and extends to the fourth vertical line along the fourth vertical line, turning in the first horizontal line;

a first dielectric layer formed on the eleventh conductive layer, the twelfth conductive layer, the thirteenth conductive layer, the fourteenth conductive layer and part of the substrate;

a fifteenth conductive layer formed on part of the first dielectric, wherein a layout of the fifteenth conductive layer starts from the first vertical line along the second horizontal line and extends to a second vertical line;

a sixteenth conductive layer formed on part of the first dielectric layer, wherein a layout of the sixteenth conductive layer starts from a seventh vertical line along the second horizontal line and extends to a sixth vertical;

a seventeenth conductive layer formed on part of the first dielectric layer, wherein a layout of the seventeenth conductive layer starts from a third vertical line along the third horizontal line and extends near to the fourth vertical line along the fourth vertical line, turning in the first horizontal line;

an eighteenth conductive layer formed on part of the first dielectric layer, wherein a layout of the eighteenth conductive layer starts from a fifth vertical line along the third horizontal line and extends near to the fourth vertical line along the fourth vertical line, turning in the first horizontal line;

a second dielectric layer formed on the fifteenth conductive layer, the sixteenth conductive layer, the seventeenth conductive layer, the eighteenth conductive layer and part of the first dielectric layer;

a nineteenth conductive layer formed on part of the second dielectric layer, wherein a layout of the ninth conductive starts from the first horizontal line along the second vertical line and extends to the second horizontal line;

a twentieth conductive layer formed on part of the dielectric layer, wherein a layout of the twentieth conductive layer starts from the first conductive layer along the third vertical line and extends to the second horizontal line;

a twenty first conductive layer formed on part of the second dielectric layer, wherein a layout of the twenty first conductive layer starts from the fourth horizontal line along the second vertical line and extends to the third horizontal line;

a twenty second conductive layer formed on part of the second dielectric layer, wherein a layout of the twenty second conductive layer starts from the fourth horizontal line along the third vertical line and extends to the third horizontal line;

a twenty third conductive layer formed on part of the second dielectric layer, wherein a layout of the twenty third conductive layer starts from the first horizontal line along the fourth vertical line and extends to the fourth horizontal line;

a twenty fourth conductive layer formed on part of the dielectric layer, wherein a layout of the twenty fourth conductive layer starts from the fourth horizontal line along the fifth vertical line and extends to the third horizontal line;

a twenty fifth conductive layer formed on part of the second dielectric layer, wherein a layout of the twenty fifth conductive layer starts from the fourth horizontal line along the sixth vertical line and extends to the third horizontal line;

a twenty sixth conductive layer formed on part of second the dielectric layer, wherein a layout of the twenty sixth conductive starts from the first horizontal line along the fifth vertical line and extends to the second horizontal line;

a twenty seventh conductive layer formed on part of the second dielectric layer, wherein a layout of the twenty seventh conductive layer starts from the first horizontal line along the sixth vertical line and extends to the second horizontal line;

a twenty eighth conductive layer formed on part of the second dielectric layer, wherein a layout of the twenty eighth starts from the first horizontal line along the seventh vertical line and extends to the fourth horizontal line;

a eleventh conductive plug formed on an intersection of the second vertical line and the second horizontal line to penetrate the second dielectric layer to electrically connected to the fifteenth conductive layer and the nineteenth conductive layer;

a twelfth conductive plug formed on an intersection of the third vertical line and the second horizontal line to penetrate the first dielectric layer and the second dielectric layer to electrically connect the eleventh conductive layer and twentieth conductive layer;

a thirteenth conductive plug formed on an intersection of the fifth vertical line and the second horizontal line to penetrate the first dielectric layer and the second dielectric to electrically connected to the twelfth conductive layer and the twenty sixth conductive layer;

a fourteenth conductive plug formed on an intersection of the sixth vertical line and the second horizontal line to penetrate the second dielectric layer to electrically connected to the sixteenth conductive layer and twenty seventh conductive layer;

a fifteenth conductive plug formed on an intersection of the second vertical line and the third horizontal line to penetrate the first dielectric layer and the second dielectric layer to electrically connected to the thirteenth conductive layer and the twenty first conductive layer;

a sixteenth conductive plug formed on an intersection of the third vertical line and the third horizontal line to penetrate the second dielectric layer to electrically connected to the seventeenth conductive layer and twenty second conductive layer;

a seventeenth conductive plug formed on an intersection of the fifth vertical line and the third horizontal line to penetrate the second dielectric layer to electrically connected to the eighteenth conductive layer and twenty fourth conductive layer; and a eighteenth conductive plug formed on an intersection of the sixth vertical line and the third horizontal line to penetrate the first dielectric layer and the second dielectric layer to electrically connected to the fourteenth conductive layer and the twenty fifth conductive layer;

an eleventh laser spot formed on the nineteenth conductive layer;

a twelfth laser spot formed on the twentieth conductive layer;

a thirteen laser spot formed on the twenty first conductive layer;

a fourteenth laser spot formed on the twenty second conductive layer;

a fifteenth laser spot formed on the twenty third conductive layer;

a sixteenth laser spot formed on the twenty fourth conductive layer;

a seventeenth laser spot formed on the twenty fifth conductive layer;

a eighteenth laser spot formed on the twenty sixth conductive layer;

a nineteenth laser spot formed on the twenty seventh conductive layer; and a twentieth laser spot formed on the twenty eighth conductive layer; wherein the electrically connected fifteenth conductive layer and nineteenth conductive layer constitute a first fuse unit;

the electrically connected eleventh conductive layer and twentieth conductive layer constitute a second fuse unit;

the electrically connected twelfth conductive layer and twenty sixth conductive layer constitute a third fuse unit;

the electrically connected sixteenth conductive layer and twenty seventh conductive layer constitute a fourth fuse unit;

the electrically connected thirteenth conductive layer and twenty first conductive layer constitute a fifth fuse unit;

the electrically connected seventeenth conductive layer and twenty second conductive layer constitute a sixth fuse unit;

the electrically connected eighteenth conductive layer and twenty fourth conductive layer constitute a seventh fuse unit;

the electrically connected fourteenth conductive layer and twenty fifth conductive layer constitute an eighth fuse unit;

the twenty third conductive layer constitutes a ninth fuse unit; and a twenty eighth conductive layer constitutes a tenth fuse unit;

wherein the first through tenth fuse units are not electrically connected to each other.

20. The fuse window according to claim 19, wherein the eleventh conductive layer, the twelfth conductive layer, thirteenth conductive layer, and fourteenth conductive layer are tungsten or polysilicon.

21. The fuse window according to claim 19, wherein the fifteenth conductive layer, the sixteenth conductive layer, the seventeenth conductive layer, and the eighteenth conductive layer are tungsten or polysilicon.

22. The fuse window according to claim 19, wherein the nineteenth conductive layer, the twentieth conductive layer, the twenty first conductive layer, the twenty second conductive layer, the twenty third conductive layer, the twenty fourth conductive layer, the twenty fifth conductive layer, the twenty sixth conductive layer, twenty seventh conductive layer and the twenty eighth conductive layer are aluminum, copper-aluminum alloy or polysilicon.

23. The fuse window according to claim 19, wherein the eleventh conductive plug, the twelfth conductive plug, the thirteenth conductive plug, the fourteenth conductive plug, the fifteenth conductive plug, the sixteenth conductive plug, the seventeenth conductive plug and the eighteenth conductive plug are tungsten or polysilicon.

24. The fuse window according to claim 19, wherein the first dielectric layer and the second dielectric layer are SiO2.

* * * * *